(12) United States Patent
Lindsey et al.

(10) Patent No.: US 7,626,396 B2
(45) Date of Patent: Dec. 1, 2009

(54) SYSTEMS AND METHODS FOR ELECTRICAL LEAKAGE DETECTION AND COMPENSATION

(75) Inventors: Robert Wayne Lindsey, Washington, IL (US); Dustin Craig Selvey, Peoria, IL (US); Arthur Wild, Chillicothe, IL (US); Robert Roy Sychra, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 206 days.

(21) Appl. No.: 11/645,568

(22) Filed: Dec. 27, 2006

(65) Prior Publication Data

US 2008/0158756 A1 Jul. 3, 2008

(51) Int. Cl.
*G01R 31/14* (2006.01)
*H02H 3/00* (2006.01)
*B60L 3/00* (2006.01)

(52) U.S. Cl. .......................... 324/509; 361/88; 307/9.1

(58) Field of Classification Search ................... 361/88; 324/509
See application file for complete search history.

(56) References Cited

U.S. PATENT DOCUMENTS

| | | | | |
|---|---|---|---|---|
| 3,670,206 | A * | 6/1972 | Sircom | 361/50 |
| 4,809,123 | A * | 2/1989 | Allington et al. | 361/42 |
| 6,518,769 | B1 * | 2/2003 | Ammon et al. | 324/534 |
| 6,646,837 | B2 * | 11/2003 | West | 361/42 |
| 6,678,132 | B1 | 1/2004 | Carruthers et al. | |
| 6,700,384 | B2 | 3/2004 | Yugou | |
| 6,958,642 | B2 | 10/2005 | Johnson et al. | |
| 6,970,807 | B2 | 11/2005 | Kito et al. | |
| 6,977,518 | B2 | 12/2005 | Higashihama et al. | |
| 6,992,490 | B2 | 1/2006 | Nomoto et al. | |
| 7,030,623 | B1 | 4/2006 | Carpenter | |
| 7,102,356 | B2 | 9/2006 | Wild | |
| 2001/0052777 | A1 | 12/2001 | Belau et al. | |
| 2004/0004481 | A1 | 1/2004 | Jin | |
| 2004/0130326 | A1 | 7/2004 | Yamamoto | |
| 2004/0189330 | A1 | 9/2004 | Herb et al. | |
| 2005/0146335 | A1 | 7/2005 | Wild | |
| 2006/0006840 | A1 | 1/2006 | Furukawa | |
| 2006/0114000 | A1 | 6/2006 | Scholl et al. | |

FOREIGN PATENT DOCUMENTS

| | | |
|---|---|---|
| JP | 06-308185 | 11/1994 |
| JP | 08-163704 | 6/1996 |
| JP | 09-274062 | 10/1997 |

OTHER PUBLICATIONS

U.S. Appl. No. 11/289,291, filed Nov. 30, 2005, by Lindsey, et al.
U.S. Appl. No. 11/589,831, filed Oct. 31, 2006, by Lindsey, et al.

* cited by examiner

*Primary Examiner*—Jeff Natalini
(74) *Attorney, Agent, or Firm*—Finnegan, Henderson, Farabow, Garrett & Dunner

(57) ABSTRACT

Systems and methods are disclosed for compensating electrical leakage and detecting balanced electrical leakage for a machine hosting an HV system. In one embodiment, a fault detection and compensation system includes a DC power supply electrically referenced to a machine frame, a leakage correction switch connected to the machine frame, a current source controlled by the leakage correction switch, and a voltage measuring device that measures an offset voltage reflecting whether the HV system is in an unbalanced fault condition. The fault detection and compensation system further includes a leakage detection and compensation controller that compensates for the unbalanced fault condition by controlling the leakage correction switch and the current source.

9 Claims, 2 Drawing Sheets

SYSTEMS AND METHODS FOR ELECTRICAL LEAKAGE DETECTION AND COMPENSATION

TECHNICAL FIELD

This disclosure relates generally to electrical leakage detection and compensation systems, and more particularly, to an electrical leakage detection and compensation system for compensating for unbalanced leakage currents and detecting balanced leakage currents in high voltage direct current systems used in machines.

BACKGROUND

A high voltage DC power supply system is required for driving an electric machine that incorporates a high voltage electrical drive motor and electric auxiliaries. The integrity of the high voltage system is critical to the reliability and safety of the machine. Typically, the machine frame is electrically isolated from the terminals or conductors of the high voltage power supply.

Under normal working conditions, DC leakage currents on the order of microamps exist between the conductors of the high voltage power supply and the machine frame. Thus, the leakage resistances between the conductors of the high voltage power supply and the frame are normally very high. However, under faulty conditions (e.g., insulation failure), electric currents from a high voltage power supply may leak to a machine frame. Such leakage currents, when significant, may be an indication of machine component fatigue or failure of a conductor's insulation. In order to ensure the proper operating conditions and the safety of the machines, it is necessary to detect electrical leakage between the conductors of the high voltage power supply and the machine frame.

Further, the configuration of certain high voltage systems requires that the high voltage and low voltage conductors of the high voltage power supply are balanced in reference to the machine frame. For example, the conductors of a high voltage power supply in the system may be +100V and −100V when referenced to the machine frame. For this type of high voltage system configuration, it is desirable to compensate for unbalanced electrical leakage currents so that the system would stay balanced and centered in reference to the machine frame.

Conventional systems and methods have been implemented to detect electrical leakage. For example, U.S. Pat. No. 6,700,384 to Yugou discloses a power source device having a cell unit comprising a plurality of cells. In Yugou, a first current line having two voltage dividing resistors interposed therebetween is connected between a positive side terminal and a negative side terminal of the cell unit. A second current line having two protection resistors and two detection resistors interposed therebetween is also connected between a positive side terminal and a negative side terminal of the cell unit. An intermediate point of the second line is grounded via an insulation resistor. The voltage difference between a voltage ($V_1$, $V_2$) detected by the detection resistors and a reference voltage ($V_c$) obtained from a point of connection between the voltage dividing resistors is provided as the input to two Op-Amps serving as the input voltage ($V_{1IN}$, $V_{2IN}$). Based on the output voltage ($V_{1OUT}$, $V_{2OUT}$) obtained from the Op-Amps, leakage occurrence is detected.

While prior art systems, such as the '384 patent, may detect electrical leakage, they do not detect electrical leakage in a balanced fault condition. The disclosed embodiments improve upon these prior art systems by, in one embodiment, providing a compensation mechanism that automatically compensates for electrical leakage in a circuit so that the circuit stays balanced in reference to the machine frame. The disclosed embodiments further improve upon prior art systems by, in another embodiment, providing a leakage detection mechanism that detects electrical leakage in a circuit with balanced leakage resistance.

SUMMARY OF THE INVENTION

Systems and methods are disclosed for compensating electrical leakage and detecting balanced electrical leakage for a machine hosting an isolated DC power supply. In one embodiment, a fault detection and compensation system includes a DC power supply electrically referenced to a machine frame (herein referred to as "HV system"), a leakage correction switch connected to the machine frame, comprising a current source controlled by the leakage correction switch, and a voltage measuring device that measures an offset voltage reflecting whether the DC power supply is in an unbalanced fault condition. The fault detection and compensation system further includes a leakage detection and compensation controller that compensates for the unbalanced fault condition by controlling the leakage correction switch and the resulting current source.

In accordance with another aspect of the disclosure, a method for compensating electrical leakage and detecting balanced electrical leakage between a power supply and a frame ground of a machine is disclosed. The machine includes an HV system. The disclosed method includes measuring a first offset voltage of the HV system in relation to frame ground, determining a first circuit unbalance in reference to the frame ground based on the first offset voltage measurement, injecting a first current into the HV system to balance the circuit, and measuring a second offset voltage. The method further includes determining whether the HV system is balanced in reference to the frame ground based on the second offset voltage measurement.

BRIEF DESCRIPTION OF THE DRAWINGS

The accompanying drawings, which are incorporated in and constitute a part of this specification, illustrate exemplary embodiments and together with the description, serve to explain these disclosed embodiments. In the drawings.

DETAILED DESCRIPTION

Figure 1:
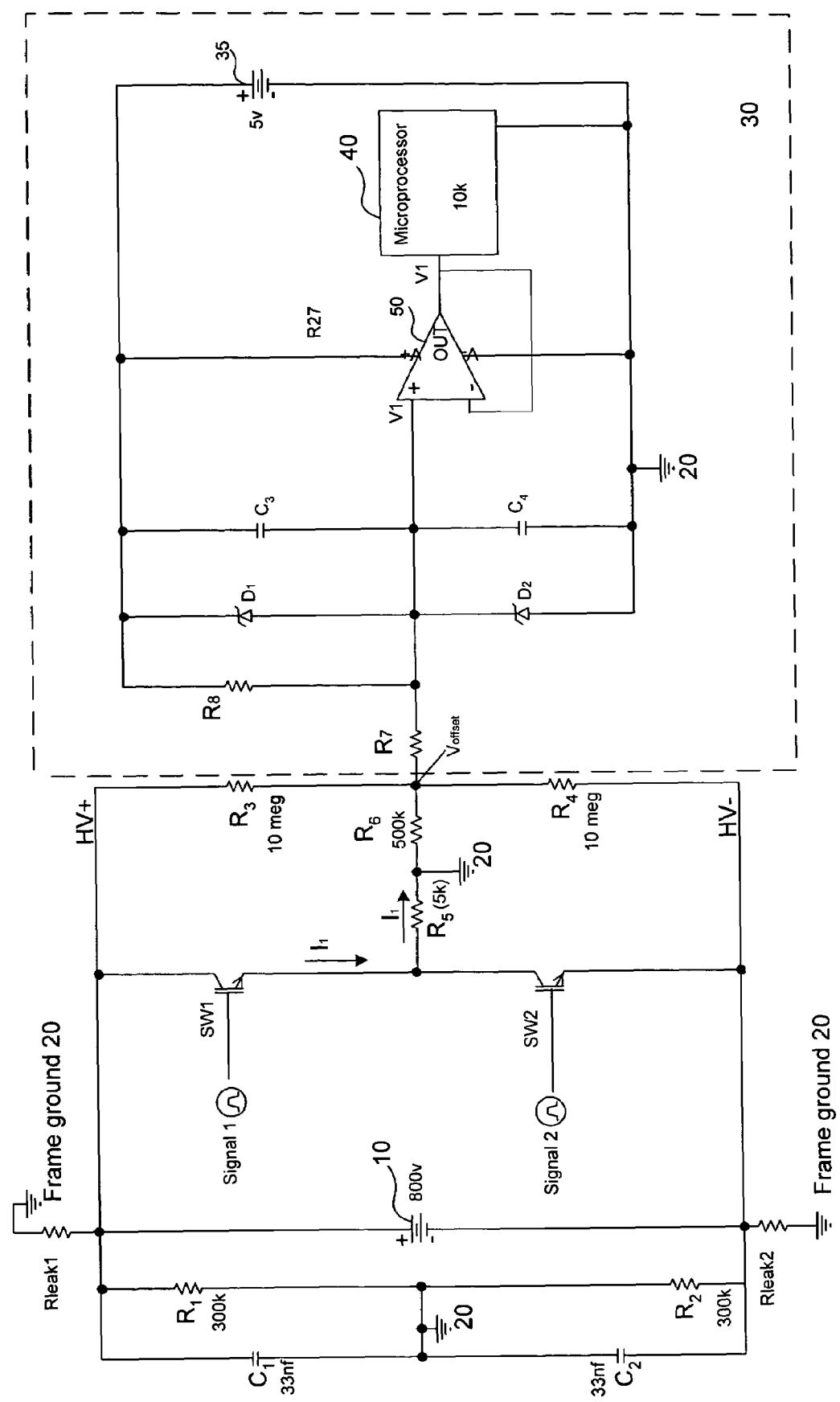
FIG. 1 is an exemplary electrical leakage detection and compensation circuit consistent with the disclosed embodiments.

Reference will now be made in detail to the disclosed embodiments, examples of which are illustrated in the accompanying drawing. Wherever possible, the same reference numbers will be used in the drawing to refer to the same or like parts.

In the disclosed embodiments, a machine may refer to a petroleum-electric hybrid powered machine, such as a hybrid-electric vehicle which uses internal combustion engines and electric batteries, fuel cell, or other electrical power source to power electric motors. A machine may also refer to any type of machine with one or more electric motors and an electric power source such as an electric vehicle. A frame may refer to the conductive support structure or housing of the machine including an electrical power source.

FIG. 1 illustrates an exemplary electrical leakage detection and compensation circuit 100 consistent with the disclosed embodiments. Electrical leakage detection and compensation circuit 100 may be used to compensate for electrical leakage currents, and to detect the presence of an electrical leakage current between a terminal of a DC power supply and the frame of a machine.

DC power supply 10 may be a generator, a battery, or any other suitable power source. In one embodiment, DC power supply 10 may be a high voltage DC power supply such as an 800 volt DC power supply. The frame of the machine including the power supply may be referred to as frame ground 20. Positive voltage bus HV+ is connected to the positive terminal of DC power supply 10. Negative voltage bus HV− is connected to the negative terminal of DC power supply 10. The HV+ and HV− are resistively referenced to frame ground 20 by $R_1$ and $R_2$. When circuit 100 is balanced (e.g., in a balanced condition), the positive and negative voltage buses (HV+ and HV−) are centered equally around frame ground 20. When circuit 100 is unbalanced (or, in an unbalanced condition), the voltage buses are not centered around frame ground 20.

Electrical leakage detection and compensation circuit 100 may also include one or more independent power supplies for supplying power to some of the circuit components. For example, a low voltage DC power supply may be a DC power supply that supplies voltage lower than that supplied by DC power supply 10, such as a 5-V DC power supply 35, which supplies power to microprocessor 40 and operational amplifier 50.

Electrical leakage detection and compensation circuit 100 may further include a number of resistors and capacitors. $R_1$ and $R_2$ are two resistors of equal resistance that balance and reference the voltage buses HV+ and HV− equally around frame ground 20. $C_1$ and $C_2$ are two capacitors of equal capacitance also used to balance and reference the voltage buses HV+ and HV− equally around frame ground 20. $R_3$ and $R_4$ are two resistors of equal resistance. $R_3$ and $R_4$ are connected to frame ground 20 through resistor $R_6$. Resistors $R_3$, $R_4$, and $R_6$ form a voltage divider between the voltages buses (HV+ and HV−) and frame ground 20.

The leakage resistance between positive voltage bus HV+ and frame ground 20 is shown in FIG. 1 as a leakage resistance $R_{leak1}$. The leakage resistance between negative voltage bus HV− and frame ground 20 is shown as a leakage resistance $R_{leak2}$. Under normal conditions (e.g., when the machine has no electrical fault), the leakage resistance (i.e., $R_{leak1}$ and $R_{leak2}$) may be relatively high (e.g., greater than 10 MΩ). Under faulty conditions (e.g., when there is an insulation breakdown), the leakage resistance ($R_{leak1}$ and $R_{leak2}$) may be unacceptably low (e.g., 100 kΩ). The range of acceptable leakage resistance values may be determined based on the type of voltage power supply, the type of machine hosting the voltage power supply, and/or the components in the machine's circuits, etc. (e.g., capacitors, resistors, etc.)

In order to detect leakage resistance ($R_{leak1}$ and $R_{leak2}$) and compensate for leakage currents (e.g., current that flows through $R_{leak1}$ and $R_{leak2}$), electrical leakage detection and compensation circuit 100 may include a leakage detection and compensation control system. Such a control system may include one or more software and/or hardware component that may be implemented to detect and compensate electrical leakage in one or more circuits, such as circuit 100. The leakage detection and compensation control system may be implemented within the machine hosting circuit 100. Alternatively, the leakage detection and compensation control system may be remote to the machine hosting circuit 100, and communicate with the machine and circuit 100 through a wireless or wireline communication network.

In one embodiment, the leakage detection and compensation system may be a leakage detection and compensation controller 30 (as shown in FIG. 1). Leakage detection and compensation controller 30 may be configured to detect the presence of a undesired electrical leakage current (i.e., an unacceptably low leakage resistance) between a terminal of a DC power supply 10 and the frame ground 20 of the machine containing power supply 10. Leakage detection and compensation controller 30 may be further configured to compensate for electrical leakage currents to ensure that circuit 100 is balanced in reference to frame ground 20. Leakage detection and compensation controller 30 may further include operational amplifier ("Op-Amp") 50 and microprocessor 40 (e.g., PIC 16F767 by Microchip Technology Inc.®).

Leakage detection and compensation controller 30 may include one or more devices that measure voltage and/or current in a circuit. For example, a voltage measuring device may be configured to measure $V_{offset}$ in circuit 100. In one embodiment, leakage detection and compensation controller 30 may include resistors $R_7$ and $R_8$. $R_7$ and $R_8$ form a voltage divider. The voltage divider is used to ensure that the input voltage $V_1$ provided to Op-Amp 50 is at equilibrium at a value of 2.5V. Leakage detection and compensation controller 30 may also include diodes $D_1$ and $D_2$ that prevent the voltage across capacitors $C_3$ and $C_4$ from rising above a specified voltage (e.g., 5 V). This may prevent damage to microprocessor 40. If the specified voltage is exceeded, diodes $D_1$ and $D_2$ may conduct to limit further voltage increases across capacitors $C_3$ and $C_4$. Capacitors $C_3$ and $C_4$ may be used to stabilize the inputs to Op-Amp 50.

Op-Amp 50 may be used as a buffer amplifier to eliminate loading effects and to interface impedances (e.g., connecting a device with a high source impedance to a device with a low input impedance). $V_1$ refers to the input voltage to Op-Amp 50. $V_1$ may have a linear relationship to $V_{offset}$, and as such, reflects the value of $V_{offset}$. Op-Amp 50 outputs $V_1$ to microprocessor 40.

Microprocessor 40 is configured to perform calculations that determine circuit unbalance, leakage resistances, leakage currents, etc. For example, microprocessor 40 may compare input voltage $V_1$ to a predetermined value and determine whether to inject current into circuit 100. Further, microprocessor 40 may be configured to control transistor switches SW 1 and SW2 based on the determination. Additionally, leakage detection and compensation controller 30 may provide data to other systems for further processing.

In one embodiment, a transistor may be used to implement switches SW1 and SW2, as shown in FIG. 1. A transistor switch may be, for example, an IGBT and is turned ON and OFF by a control signal, such as control signal 1. Signal 1 and signal 2 may be an ON-OFF control signal generated by control circuit 30 (e.g., controlled by microprocessor 40) that generates signals of predetermined or varying values (e.g., DC voltage levels, pulse width modulated, frequency, etc.). In one embodiment, as shown in FIG. 1, transistor switch SW 1 is connected to the positive voltage bus HV+ and balance resistor $R_5$, which is connected to frame ground 20. $R_5$ is a resistor used to establish a current path between SW1 or SW2 and frame ground 20. Transistors SW1 and SW2 may also be used as a current source that injects current at predetermined levels for one or more predetermine time intervals into circuit 100.

For example, microprocessor 40 may control signal 1 to provide a positive voltage (e.g., a voltage of a predetermined positive level) to the gate of transistor switch SW 1. Transistor switch SW1 is then placed in an ON (i.e., conducting) condition. This causes $R_5$ to be connected between SW 1 and frame ground 20. In this "ON" condition, microprocessor 40 may use signal 1 to inject a known current (i.e., switching on a current source) into frame ground 20 through $R_5$.

When signal 1 does not provide sufficient positive voltage (e.g., a voltage below the threshold level) to the gate of transistor switch SW1 or SW2, transistor switches SW1 and SW2 are OFF (i.e., non-conducting). In this "OFF" condition, $R_5$ is disconnected from frame ground 20, and resistors $R_1$, ($R_3$+$R_6$), $R_{leak1}$, and capacitor $C_1$ form a parallel configuration between the positive voltage bus HV+ and frame ground 20.

As shown in FIG. 1, in one embodiment, the DC power supply 10 is a 800 volt DC power supply, although other types of power supplies may also be implemented consistent with the disclosed embodiments. In FIG. 1, $R_1$ and $R_2$ are two resistors of 300 kΩ. $R_3$ and $R_4$ are resistors of 10 MΩ. $R_6$ is a resistor of 500 kΩ. $C_1$ and $C_2$ are two capacitors of 33 nF. The values of resistors $R_1$-$R_4$, $R_6$, $C_1$, and $C_2$, as shown in FIG. 1, are exemplary, and the components of circuit 100 may be of other values.

In FIG. 1, resisters $R_1$-$R_4$, $R_6$, and capacitors $C_1$, and $C_2$ are evenly distributed between the positive voltage bus HV+, frame ground 20, and the negative voltage bus HV− ($R_1$=$R_2$, $R_3$=$R_4$, and $C_1$=$C_2$). When the resistance of $R_{leak1}$ equals the resistance of $R_{leak2}$, the leakage resistance is also evenly distributed between the positive voltage bus HV+, frame ground 20, and the negative voltage bus HV−. In this case, circuit 100 is considered to be in a balanced fault condition. Conversely, when the resistance of $R_{leak1}$ does not equal that of $R_{leak2}$, circuit 100 is considered to be in an unbalanced fault condition.

When circuit 100 is unbalanced, the voltage across positive voltage bus HV+ and frame ground 20 does not equal the voltage across the frame ground 20 and the negative voltage bus HV−. The circuit unbalance may be presented as a function of the positive and negative voltages (i.e., HV+ and HV−). In one embodiment, the ground fault detection (GFD) unbalance (percentage) of circuit 100 may be defined as:

$$GFD \text{ Unbalance} = 1 - \left| \frac{HV-}{\frac{HVDC}{2}} \right| \quad (1)$$

Where HVDC=(HV+)−(HV−).

To determine the HV unbalance (voltage) of circuit 100, leakage detection and compensation controller 30 may first measure $V_{offset}$. $V_{offset}$ refers to the voltage measurement across the resistor $R_6$. Because $R_3$, $R_4$, and $R_6$ form a voltage divider, $V_{offset}$ can be calculated based on the following equation.

$$V_{offset} = \frac{\left(\frac{HV-}{R_4} + \frac{HV+}{R_3}\right)}{\left(\frac{1}{R_3}\right) + \left(\frac{1}{R_4}\right) + \left(\frac{1}{R_6}\right)} \quad (2)$$

Because HVDC=(HV+)−(HV−) and HVDC is the known voltage of DC power supply 10, using the $V_{offset}$ measurement, leakage detection and compensation controller 30 may apply equation 2 to the $R_3$, $R_4$, $R_6$ voltage divider ratio. For example, in FIG. 1, the divider ratio $((R_3||R_4)+R_6)/R_6$=11.

The voltage unbalance of circuit 100, as defined by equation 1, may therefore be determined by controller 30. For example, under normal conditions with no leakage currents such as when $R_{leak1}$ and $R_{leak2}$ are of large relative values in circuit 100, HV+=|HV−|. Therefore, the measurement of $V_{offset}$=0 V. Leakage detection and compensation controller 30 may determine that circuit 100 is in a balanced condition with no fault. Further, controller 30 allows the determination of magnitude of the unbalanced conditions without knowing the values of HV+ or HV− by the following equation.

$$HV_{unbalance} = V_{offset} \times ((R_3||R_4)+R_6)/R_6,$$

where $((R_3||R_4)+R_6)/R_6$ is the divider ratio.

When the resistance of $R_{leak1}$ does not equal that of $R_{leak2}$, and the leakage resistances are unacceptably low values (i.e., the leakage current in the circuit is significant), circuit 100 is considered to be in an unbalanced fault condition. When circuit 100 is in an unbalanced fault condition, HV+≠|HV−|. As such, leakage detection and compensation controller 30 may measure $V_{offset}$, and then use $V_{offset}$ to calculate the $HV_{unbalance}$. Further, leakage detection and compensation controller 30 may decide to balance circuit 100 by injecting a current into circuit 100 using SW1 or SW2

When the resistance of $R_{leak1}$ equals that of $R_{leak2}$, and the leakage resistances are unacceptably low values, circuit 100 is in a balanced fault condition. Under such balanced faulty conditions HV+=|HV−|, therefore, $V_{offset}$=0 V (see equation 2). As such, measurements of $V_{offset}$ may show that the circuit is balanced. To detect the electrical leakage under a balanced fault condition, leakage detection and compensation controller 30 may inject a known current into circuit 100 using SW1 or SW2.

As discussed above, when there is electrical leakage in circuit 100, leakage detection and compensation controller 30 may be configured to first detect whether circuit 100 is in a balanced condition. If circuit 100 is unbalanced ($V_{offset}$≠0 V), leakage detection and compensation controller 30 may calculate the $HV_{unbalance}$ and turn on SW1 or SW2 to balance circuit 100. If circuit 100 is balanced ($V_{offset}$=0 volt), leakage detection and compensation controller 30 may then turn on SW1 or SW2 for a specific time interval variation to detect the existence of undesired balanced electrical leakage paths between negative and positive voltage buses (i.e., HV− and HV+) and frame ground 20. This leakage compensation and detection process is further described in connection with FIG. 2.

Figure 2:
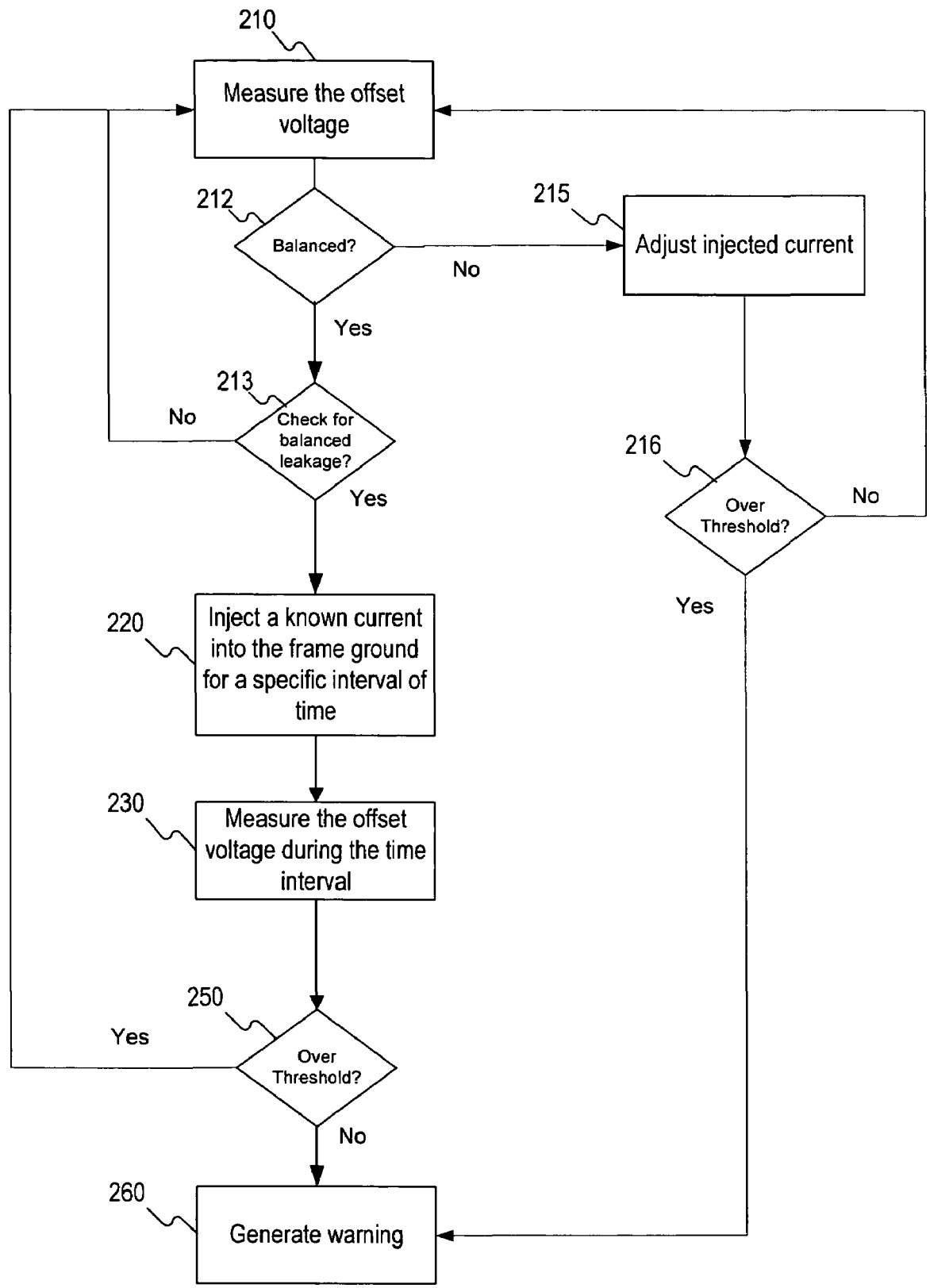
FIG. 2 is a flow chart of an exemplary process for detecting and compensating for electrical leakage consistent with the disclosed embodiments.

FIG. 2 illustrates an exemplary process for compensating and detecting electrical leakage consistent with the disclosed embodiments. To detect an undesired electrical leakage resistance in a balanced fault condition in circuit 100, leakage detection and compensation controller 30 may measure $V_{offset}$ to determine whether circuit 100 is in a balance condition ($V_{offset}$=0 volt) (step 210).

Depending on the specification of the machine hosting circuit 100, and the information related to components of circuit 100, leakage detection and compensation controller 30 may determine a balance threshold voltage (e.g., |BalanceThreshold|=5 V). When determining whether circuit 100 is in a balanced condition, leakage detection and compensation controller 30 may compare the predetermined balance threshold voltage to the $V_{offset}$ measurement (step 212). In one embodiment, if $V_{offset}$ is below the predetermined threshold (e.g., |$V_{offset}$|<5 V) leakage detection and compensation controller 30 may determine that the circuit is balanced. If $V_{offset}$ is over the threshold, leakage detection and compensation controller 30 may determine that circuit 100 is unbalanced. Leakage detection and compensation controller 30 may further determine that the unbalanced leakage currents should be compensated so that circuit 100 would be brought back to a balanced condition.

Further, leakage detection and compensation controller 30 may set a second warning threshold voltage. In one embodiment, when $V_{offset}$ is over the warning threshold (e.g., circuit 100 is severely unbalanced), leakage detection and compensation controller 30 may determine that circuit 100 may have severe faulty conditions, and issue a warning signal/message accordingly.

If circuit 100 is unbalanced and $V_{offset}$ is below the warning threshold voltage, leakage detection and compensation controller 30 may control switches SW1 and SW2 to balance circuit 100 by injecting compensating currents into circuit 100 (step 215). For example, when $V_{offset}$>5 V, circuit 100 has a leakage current between negative bus HV- and frame ground 20 (leakage current flowing though $R_{leak2}$), and HV+>|HV-|. To balance circuit 100, leakage detection and compensation controller 30 may apply control signal 1 to SW1, which initiates a current path between the positive voltage bus HV+ and frame ground 20 (compensating current $I_1$ flowing through $R_5$). When SW1 is conducting, capacitor $C_1$ becomes electrically coupled to resistor $R_5$. An electrical current path is established from one terminal of capacitor $C_1$ to SW1. The other terminal of capacitor $C_1$ is connected to frame ground 20. Because one terminal of capacitor $C_1$ is connected to frame ground 20, and that the current $I_1$ flows into frame ground 20 through resistor $R_5$, capacitor $C_1$ would begin discharging exponentially with a time constant of RC, wherein C is the capacitance of $C_1$; and R is the resistance coupled with (e.g., the parallel configuration of $R_1$ and $R_5$) capacitor $C_1$.

Additional circuit components may have a minor contribution to the RC time constant, such as, but not limited to $R_3$, $R_4$, and $R_6$, and are considered negligible in this example but may be considerable in another implementation and compensated for by controller 30. After a specific time interval (determined by the RC constant), for example, 5 milliseconds, the voltage on capacitor $C_1$ may be sufficiently decreased so that circuit 100 may be balanced with both positive and negative buses evenly charged with respect to ground frame 20.

Once circuit 100 is balanced, leakage detection and compensation controller 30 may re-measure offset voltage $V_{offset}$ to verify that circuit 100 is in a balanced condition (step 216). As explained earlier, when $V_{offset}$ is over a pre-determined warning threshold (e.g., circuit 100 is severely unbalanced), leakage detection and compensation controller 30 may determine that circuit 100 may have severe faulty conditions, and issue a warning signal/message accordingly (step 260).

If leakage detection and compensation controller 30 determines that circuit 100 is balanced, controller 30 may determine the presence of balanced electrical leakage (step 213). To make the determination, leakage detection and compensation controller 30 may inject a known current into circuit 100 for a specific time interval (step 220).

In one embodiment, because circuit 100 is in a balanced condition, the initial voltage $V_0$ on capacitor $C_1$ equals to HVDC/2. Leakage detection and compensation controller 30 may turn on SW1 and inject current $I_1$. Current $I_1$ flows through resistor $R_5$ to frame ground 20. Capacitor $C_1$ is therefore discharged because one terminal of capacitor $C_1$ is connected to frame ground 20, which is charged by the established current path. The voltage across capacitor $C_1$ would drop exponentially over time t (i.e., $V(t)=V_0 e^{-t/RC}$) with a time constant of RC, wherein C is the capacitance of $C_1$ and other capacitances between the HV+ and frame ground 20 and between HV- and frame ground 20, and R is the resistance reflecting $R_1$, and $R_5$.

After current $I_1$ is being injected into circuit 100 for a predetermined time interval, leakage detection and compensation controller 30 may measure $V_{offset}$ over the predetermined time interval (step 230). As shown in equation 2, $V_{offset}$ has a linear relationship to the voltage across capacitor $C_1$ (i.e., HV+). As such, the measurement of $V_{offset}$ over the time interval reflects the same RC constant of V(t) as described above. Further, at the end of the predetermined time interval, $V_{offset}$ is measured and compared to the $V_{offset}$ measurement before the current $I_1$ was injected.

After measuring $V_{offset}$, leakage detection and compensation controller 30 may determine whether the change in $V_{offset}$ is less than a pre-determined threshold value (Step 250). When the change in $V_{offset}$ is over the threshold value, leakage and compensation controller 30 may start the leakage detection and compensation process again or upon request. When the change in $V_{offset}$ is less than the threshold value, leakage detection and compensation controller 30 may determine that the machine has faulty insulation or some other type of problem, and generate and provide one or more types of warnings (Step 260). For example, leakage detection and compensation controller 30 may transmit warnings to notify an operator of the machine via a display panel. For instance, upon detection of a leakage current, a display panel may display a message requesting that the machine be serviced.

INDUSTRIAL APPLICABILITY

Methods and systems consistent with the disclosed embodiments may be implemented for leakage compensation in an electrical vehicle or a hybrid vehicle. Further, methods and systems consistent with the disclosed embodiments may be used for leakage compensation in any type of machine that requires a electrical power supply for its operations.

Methods and systems consistent with the disclosed embodiments may be implemented for leakage detection in an electrical vehicle or a hybrid vehicle. Further, methods and systems consistent with the disclosed embodiments may be used for leakage detection in any type of machine that requires a electrical power supply for its operations.

Systems and methods consistent with the disclosed embodiments may also be implemented within a machine having a data communication link to provide an error signal to a monitoring system detecting and/or indicating the severity of the fault condition caused by the leakage current. For example, when the circuit unbalance is over a threshold value, the monitoring system may determine that the machine has a faulty connection or some other type of problem. When circuit unbalance is detected, various levels of warnings may be generated to notify, for example, the operator of the machine via a display panel. For instance, upon detection of a circuit unbalance, a display panel may display a message requesting that the machine be serviced. Alternatively, remote warnings may be provided to entities or systems remotely connected to the machine.

In another example, when the balanced leakage current is over a threshold value, the monitoring system may determine that the machine has a faulty connection, faulty insulation or some other type of problem. When leakage current is detected, various levels of warnings may be generated to notify, for example, the operator of the machine via a display panel or remotely located entities or systems. For instance, upon detection of a leakage current, a display panel may display a message requesting that the machine be serviced.

Systems and methods consistent with the disclosed embodiments may further be implemented within a machine to collect multiple sets of data over a period of time in order to analyze system faults based on the collected data. For example, the electrical leakage detection and compensation controller may switch the current sources in and out of circuit 100 multiple times over a defined time period. The electrical leakage detection and compensation controller may determine the circuit unbalance and leakage resistance each time. The electrical leakage detection and compensation controller may further analyze the pattern in the circuit unbalance and leakage resistance data. Based on this analysis, the electrical leakage detection and compensation controller may identify the electrical/mechanical component fault in the machine that implements circuit 100.

In one embodiment, the leakage detection and compensation controller may store patterns of circuit characteristics mapped to various machine conditions, such as a faulty wire connection. For example, the leakage detection and compensation controller may detect rapid toggles of voltage values in the $V_{offset}$ measurements in circuit 100. The leakage detection and compensation controller may compare this pattern of voltage toggles against those stored in its data storage. The leakage detection and compensation controller may thereby identify this voltage toggle pattern as one or more faulty wire connections in the machine. The voltage toggle patterns may also represent a typical or normal condition. For example, when a device or machine component is turned on, there may be a known leakage associated with it, and the new leakage becomes the normal condition for the machine. Therefore, the leakage detected may reflect a normal condition.

The implementation of the disclosed systems and methods are not limited to the circuit shown in FIG. 1. It will be apparent to those skilled in the art that various modifications and variations of the disclosed embodiments can be made. Additionally, other embodiments of the disclosed methods and systems will be apparent to those skilled in the art from consideration of the specification. It is intended that the specification and examples be considered as exemplary only, with a true scope of the disclosure being indicated by the following claims.

What is claimed:

1. A method for compensating electrical leakage and detecting balanced electrical leakage between a power supply and a frame ground of a machine that includes an HV system, the method including:

measuring a first offset voltage in the HV system;

determining a first circuit unbalance in reference to the frame ground based on the first offset voltage measurement;

injecting a first current into the frame ground to balance the HV system;

measuring a second offset voltage; and determining whether the HV system is balanced in reference to the frame ground based on the second offset voltage measurement.

2. The method of claim 1, further including:

interposing a voltage divider between a positive voltage side of the power supply, a negative side of the power supply, and the frame ground; and measuring the first and second offset voltages across a resistor of the voltage divider.

3. The method of claim 1, further including:

determining whether the first offset voltage is over a threshold value; and outputting a warning signal if the first offset voltage is over the threshold value.

4. The method of claim 1, further including:

determining whether the HV system is in a balanced fault condition.

5. The method of claim 4, further including:

injecting a second current into the HV system for a second time interval.

6. The method of claim 5, further including:

measuring the offset voltage continuously during the second time interval.

7. The method of claim 6, further including:

determining an RC constant based on the offset voltage measurement during the second time interval; and determining a balanced leakage resistance and a leakage current based on the RC constant.

8. The method of claim 6, further including:

comparing offset voltage measurements before and after the second time interval.

9. The method of claim 8, further including:

determining whether a change in the offset voltage measurements is under a threshold value; and outputting a warning signal if the change in the offset voltage measurements is under the threshold value.

* * * * *